United States Patent [19]

Liang et al.

[11] Patent Number: 5,386,141

[45] Date of Patent: Jan. 31, 1995

[54] LEADFRAME HAVING ONE OR MORE POWER/GROUND PLANES WITHOUT VIAS

[75] Inventors: Louis H. Liang, Los Altos; Tsing-Chow Wang, San Jose, both of Calif.

[73] Assignee: VLSI Technology, Inc., San Jose, Calif.

[21] Appl. No.: 860,810

[22] Filed: Mar. 31, 1992

[51] Int. Cl.$^6$ ............................................. H01L 23/48
[52] U.S. Cl. ..................................... 257/676; 257/691
[58] Field of Search .................... 257/676, 691, 783

[56] References Cited

U.S. PATENT DOCUMENTS

| | | | |
|---|---|---|---|
| 4,714,952 | 12/1987 | Takekawa et al. | 257/676 |
| 4,791,473 | 12/1988 | Phy | 257/691 |
| 5,012,323 | 4/1991 | Farnworth | 257/676 |
| 5,161,304 | 11/1992 | Queyssac et al. | 257/676 |
| 5,196,725 | 3/1993 | Mita et al. | 257/691 |
| 5,220,195 | 6/1993 | McShane et al. | 257/691 |

FOREIGN PATENT DOCUMENTS

| | | |
|---|---|---|
| 210371 | 2/1987 | European Pat. Off. |
| 2007546 | 11/1990 | Japan . |
| 2294041 | 12/1990 | Japan . |
| 3166755 | 7/1991 | Japan . |
| 3166756 | 7/1991 | Japan . |

Primary Examiner—Rolf Hille
Assistant Examiner—Roy Potter
Attorney, Agent, or Firm—Patrick T. King

[57] ABSTRACT

Power and ground connections are provided using or more conductive layers provided in an integrated-circuit package design. A leadframe has either a tape assembly or a heat-conducting dielectric ceramic substrate attached to the die-attach paddle of the leadframe and one or more conductive planes are formed on the top surface of the tape assembly or the ceramic substrate. The tape assembly includes a conductive metal layer, a polyimide layer, and an adhesive layer. The metal layer on the tape or ceramic substrate and the metal die-attach pad of the leadframe are used as low inductance power planes providing connections to the integrated-circuit. No vias are used. Use of a metal die-attach paddle for the leadframe is optional when a ceramic substrate is used.

18 Claims, 5 Drawing Sheets

LEADFRAME HAVING ONE OR MORE POWER/GROUND PLANES WITHOUT VIAS

BACKGROUND OF THE INVENTION

1. Field of the Invention. This invention relates to packaging techniques for integrated circuits and more particularly to techniques for providing power and ground planes for making connections to an integrated-circuit die.

2. Prior Art. The footprint, or area, of a semiconductor package with a high I/O lead count is generally much larger than the footprint of the silicon integrated-circuit die contained in the package. The leadframe provides an interface between the I/O pins for the package, which may be several hundred in number, and the corresponding bonding pads on the periphery of the integrated-circuit die. A leadframe functions to converge a large number of conductors in the leadframe into a small area near the die itself. Because of the leadframe geometry restrictions, the size of the leads and the spacing between the leads are small. Bonding fingers are provided on the leadframe adjacent to the integrated-circuit die for connection of the leads of the leadframe to the bonding pads on the integrated-circuit die. The inductance (typically 10–20 nanohenrys) of the bonding wires used for interconnecting the die to the bonding fingers of the leadframe often limits the electrical performance of the integrated-circuit package, particularly for distribution of power and ground, where problems of groundbounce and conducted interference degrade operation of the integrated circuits on the die.

One solution to this problem is to provide large low-inductance conductive planes in a multi-layer chipcarrier package configuration. Several conductive planes are provided within the base of the package and conductive vias provide connections to the various planes. Fabrication of this type of multi-layers and vias are expensive. An inexpensive solution which includes a low cost molded-plastic epoxy package design to obtain improved power-distribution performance is needed.

SUMMARY OF THE INVENTION

It is therefore an object of the invention to provide a low-cost, multi-layer plastic integrated-circuit package having improved power distribution for improved electrical performance in high speed applications.

The invention provides power and ground planes for carrying heavy currents to an integrated-circuit die in a package. The techniques of the invention are also useful for providing connections for I/O signals.

One embodiment of the invention provides a power/-ground plane using a tape assembly composed of a conductive metal layer, a polyimide layer, and an adhesive layer. The tape is attached to the leadframe using the adhesive layer with the polyimide layer being between the metal die-attach pad area of the leadframe and the conductive metal layer of the tape. The metal die-attach pad of the leadframe may also be used as an additional power/ground plane. An integrated-circuit die is then attached on top of the tape and the signal I/O and power/ground leads of the die are wire-bonded to the leads of the leadframe and/or the metal layer on the tape. The metal die-attach pad of the leadframe and the metal layer on the tape are used as low inductance power-connection planes for the integrated-circuit. The metal layer on the tape is used to interconnect the power and ground bonding pads on the integrated-circuit die and the leadframe. No vias are used between the die pads and the metal layer on the tape. This arrangement is molded into a plastic-molded package.

Another embodiment of the invention uses a heat-conducting, electrically-insulated die-attach substrate which is used either with or without the die-attach paddle of a leadframe. The heat-conducting, electrically-insulated die-attach substrate is formed of a ceramic material. Conductive traces for distribution of power/-ground are printed or deposited on the ceramic substrate.

An important feature of the invention is that the adhesive tape or the ceramic substrate with a conductive metal layer is attached to a conventional metal layer leadframe, having a conductive die-attach paddle. These arrangements provide at least two low-impedance, isolated power and ground conductors to reduce the amount of inductive noise in the package. This design concept can be extended for multi-chip applications. Isolated metal traces can also be used to provide connections for I/O signals to the integrated-circuit die. The invention provides improved power-distribution planes for carrying heavy currents. The conductors for carrying power/ground traces according to the invention permit the total number of leads on the lead frame dedicated to power/ground distribution to be reduced. Consequently, the number of package leads available for I/O signals in a given package size can be increased, if desired.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Figure 1:
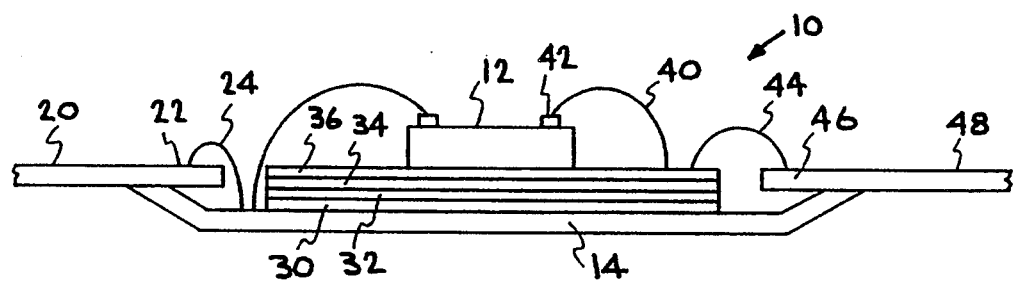
FIG. 1 is a sectional view showing a die-attach paddle of a metal leadframe, which provides a first conductive layer for providing power to an integrated-circuit die, and a tape fixed to the die-attach paddle, which provides a second conductive layer for providing power to an integrated-circuit die.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. The reference numerals used in connection with the descriptions of the various elements of the various embodiments of the invention to sometimes designate typical elements; and, for clarity, other similar elements are not designated with reference numerals. For example, all of the leads of a multi-lead leadframe are not designated with reference numerals nor are all of the bonding wires for connecting I/O signals to an integrated circuit.

Figure 2:
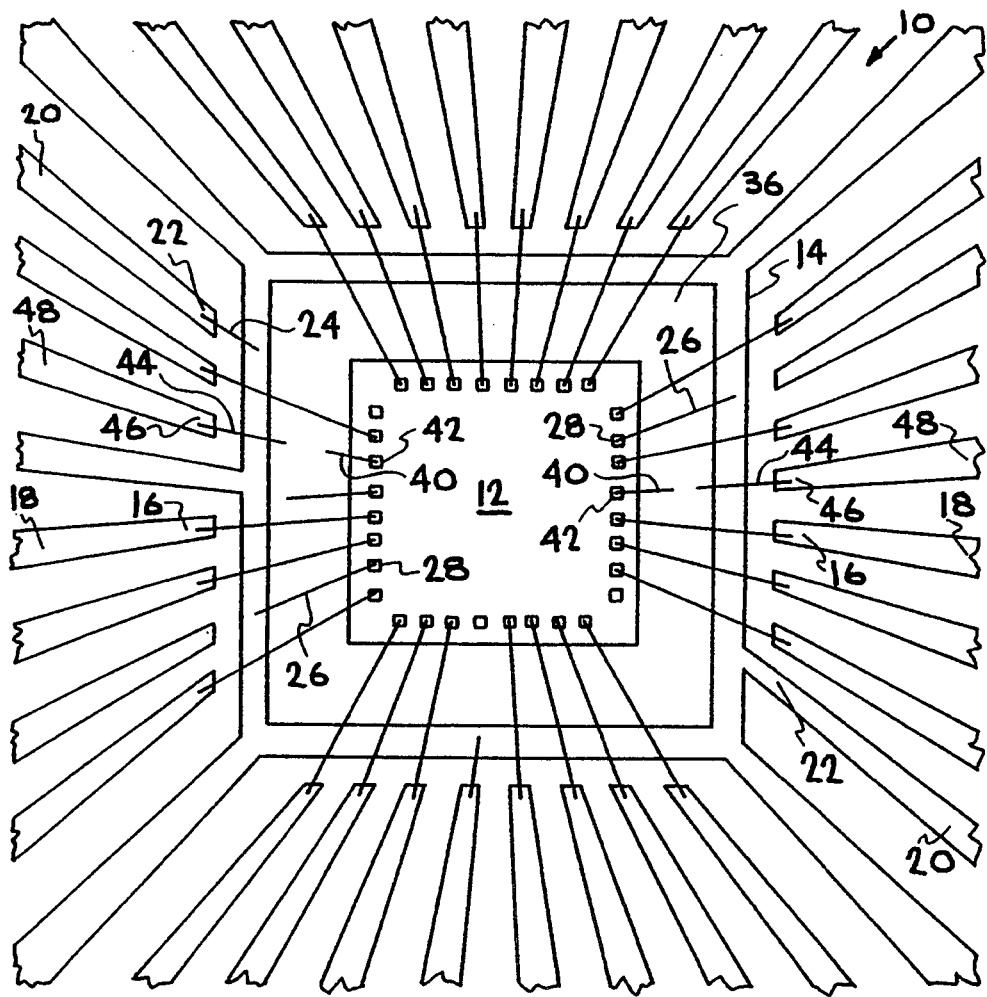
FIG. 2 is a plan view of the leadframe and conductive layers for the arrangement of FIG. 1.

FIG. 1 shows in a sectional view and FIG. 2 shows in a plan view an integrated-circuit package arrangement 10 for distributing power to an integrated-circuit die 12. The central area of a leadframe is shown having a centrally-located die-attach paddle member 14. A number of bonding fingers 16 are connected to leads 18 of the leadframe. The bonding fingers 16 are conventionally located adjacent to the die-attach paddle member 14, as indicated in the figures. As described hereinbelow, the metal die-attach paddle 14 itself serves as a first conductive layer for distributing power to the integrated-circuit die 12. Connections to one terminal of a power supply source are provided by the leads 20. Bonding fingers 22 at the inner ends of the leads 20 are wire-bonded to the metal die-attach paddle 14 with the bonding wires 24 providing power connections to the metal plane of the die-attach paddle 14. Alternatively or additionally, the tie-bars at each corner of the die-attach paddle 14 can be used to provide direct power connections to the die-attach paddle, If a non-standard leadframe is used, the leads 22, for example, can be extended to attach directly to the die-attach paddle 14, in place of the bonding wires 24.

Connections from the die-attach paddle 14 are made with bonding wires 26 to bonding pads 28. The metal die-attach paddle 14 thereby provides a low-inductance connection to the bonding pads on the integrated-circuit die from the package leads.

FIG. 1 shows several layers of materials on the die-attach paddle 14. The thicknesses of the various layers are not shown to scale. The lowest layer is an adhesive layer 30. The next layer is a polyimide dielectric tape layer 32 which is bonded to the die-attach paddle 14 with the adhesive layer 30. The dielectric tape layer 32 has a conductor formed on its upper surface. The conductor includes a lower copper layer 34, on which is formed a thin upper conductive top layer 36 of gold. The gold layer 36 is used to bond the integrated-circuit die 12 to the package.

FIG. 2 shows one set of bonding wires 40 connected between respective bonding pads (typically shown as 42) on the integrated-circuit die 12 and the upper conductive layer 36 on the polyimide dielectric tape layer 32. A second set of bonding wires 44 is connected between respective bonding fingers 46 of the leads 48 and the upper conductive layer 36. The leads 48 are connected to appropriate power voltage sources for the integrated-circuit die 12. The conductive layers 34,36 serve as a second conductive plane for distributing power to the integrated-circuit die 12. No vias are used to obtain the two power-supply planes provided by the die-attach paddle 14 and the conductive layers 34,36.

Figure 3:
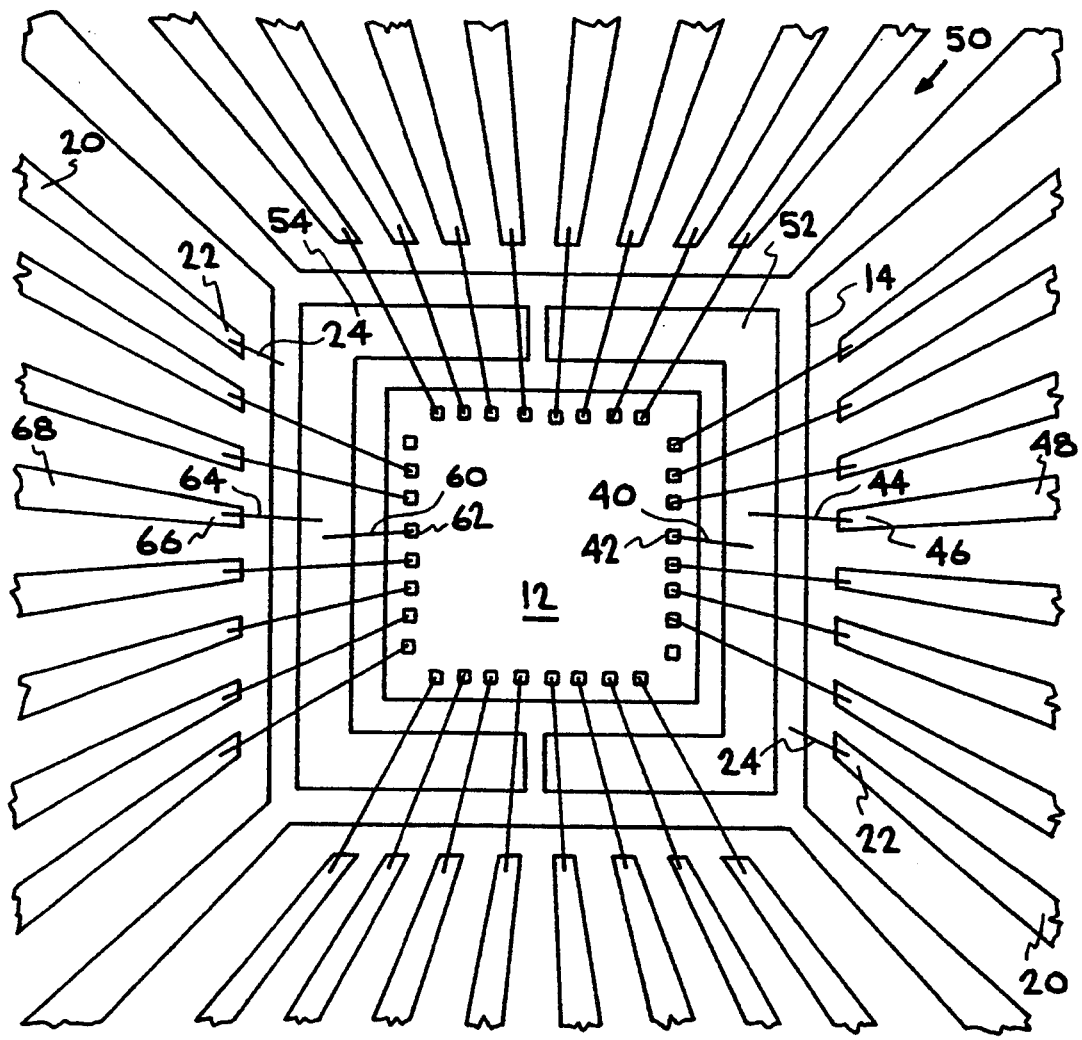
FIG. 3 is a, plan view similar to FIG. 3, where the second conductive layer oil the tape is divided into two separate conductive areas

FIG. 3 shows an integrated-circuit package arrangement 50 similar to the integrated-circuit package arrangement of FIG. 1. In this case, the conductive layer on the polyimide tape is split into two separate sections 52,54. This provides two additional separate power planes for the package, in addition to the power plane provided by the die-attach paddle 14. In this case, the section 54 serves as a separate low-inductance power plane in the package. A bonding wire 60 connects the power-plane section 54 to a typical power bonding pad 62 for power. Another bonding wire 64 connects the power-plane section 54 to a bonding finger 66 on a power lead 68 for the package.

Figure 4:
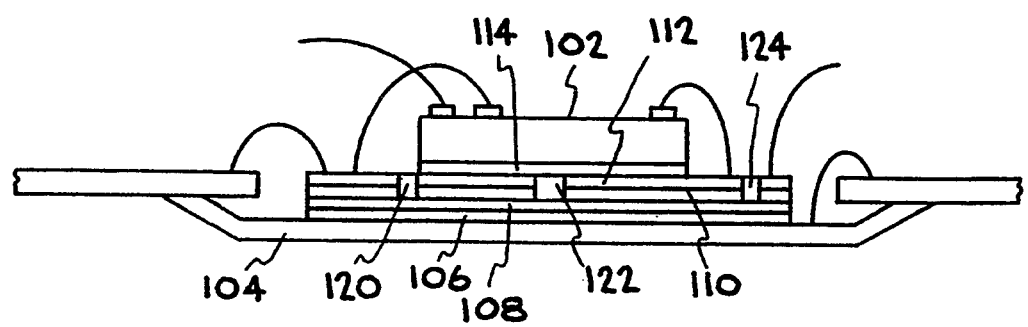
FIG. 4 is a sectional view of an packaging configuration in which the integrated-circuit die is attached to the tape with a non-conductive adhesive.

FIG. 4 is a sectional view of another packaging configuration 100 for distributing power to an integrated-circuit die 102. The central area of a leadframe is shown having a centrally-located die-attach paddle member 104. Several layers of materials are formed over the die-attach paddle 104. The thicknesses of the various layers are not shown to scale. The lowest layer is an adhesive layer 106. The next layer is a polyimide dielectric tape layer 108 which is bonded to the die-attach paddle 104 with the adhesive layer 106. The dielectric tape layer 108 has a two-layer conductor formed on its upper surface. The conductor includes a lower copper layer 110, on which is formed a thin upper conductive top layer 112 of gold. The gold layer 112 is used to bond the integrated-circuit die 102 to the package. The die 102 is attached to the package using a non-conductive adhesive layer 114 to bond the integrated-circuit die 102 to the gold layer 112.

As indicated in the drawing, the conductive layers 110,112 extend horizontally over the dielectric tape layer 108 and are broken into several sections by dielectric barriers 120,122,124 to form four sections. These sections function like the power planes 52,54 of FIG. 3 to provide various voltages to the integrated-circuit die 102. Various bonding wires are illustrated to indicate the variety of combinations of connections available between the various bonding fingers, bonding pads on the integrated-circuit, and the various power planes.

Figure 5:
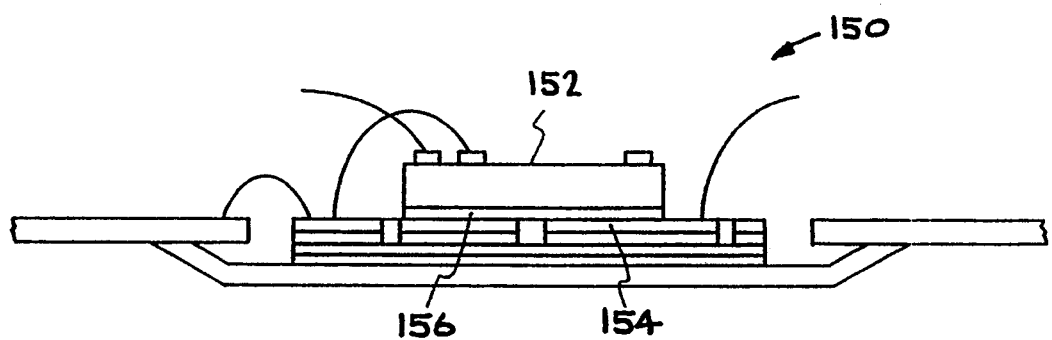
FIG. 5 is a sectional view of another package configuration in which the integrated-circuit die is attached to the tape with a conductive adhesive.

FIG. 5 is a sectional view of yet another package configuration 150. This configuration is similar to that of FIG. 4 except that an integrated-circuit die 152 is bonded to a top conductor layer 154 with a layer of conductive adhesive 156.

Figure 6:
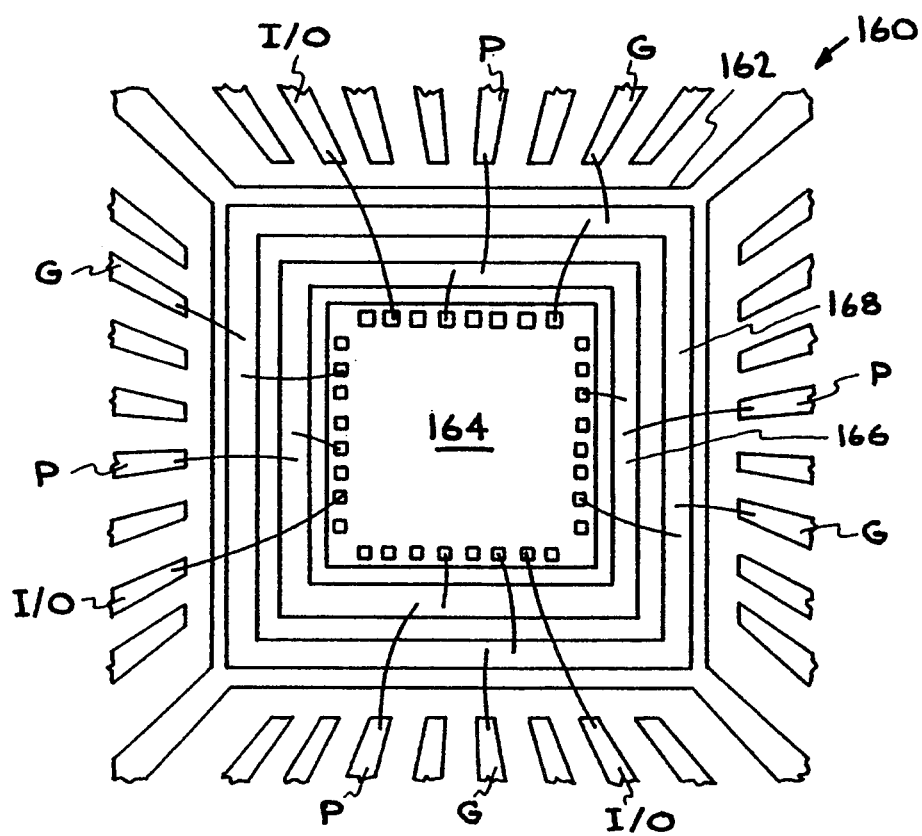
FIG. 6 is a plan view of a die and an alternative pattern of conductive traces/for distribution of power to an integrated-circuit die.

FIG. 6 shows another package configuration 160 with a die-attach paddle 162 and a die 164. Conductive traces 166,168 are formed as rectangular frames surrounding the die 164 for distribution of power to the integrated-circuit die 164 as described in connection with the various embodiments of the invention described hereinabove. Various bonding wires are indicated for providing connections between the various power planes, bonding pads on the integrated-circuit die, the power P and ground G leads of the leadframe, and the metal die-attach paddle.

Figure 7:
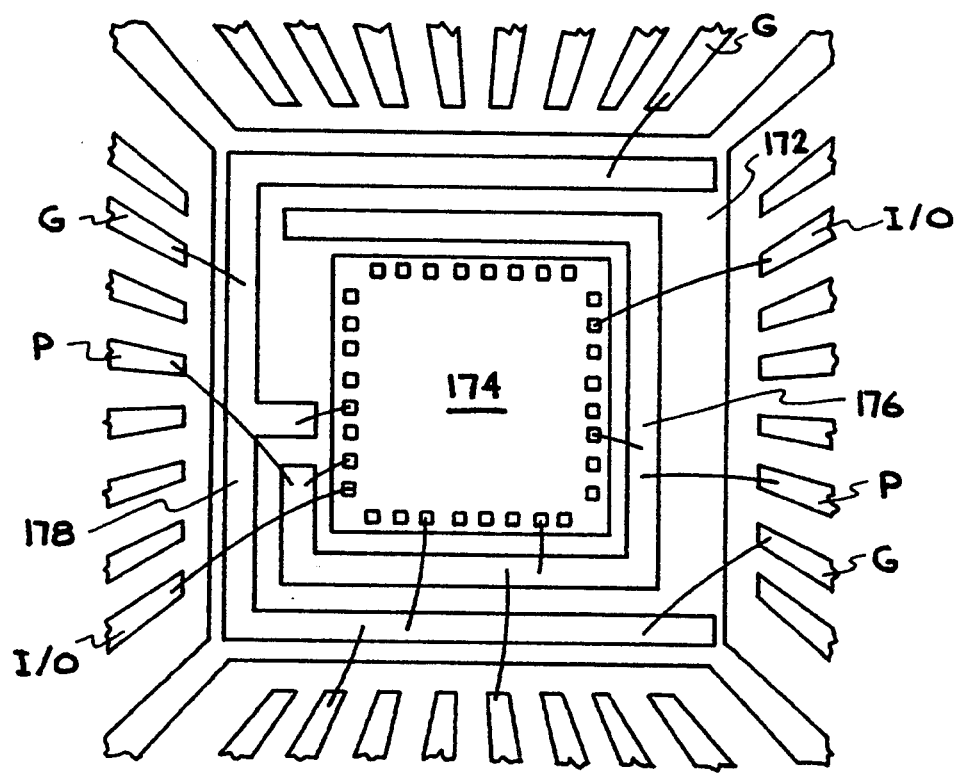
FIG. 7 is a plan view of a die and another alternative pattern of conductive tracer for distribution of power to an integrated-circuit die.

FIG. 7 shows a leadframe with a die-attach paddle 172 and a die 174. Conductive traces 176, 178 are formed as intermeshed C-shaped patterns surrounding the die for distribution of power to an integrated-circuit die as described in connection with the embodiments of the invention described hereinabove. Various bonding wires are shown for connections between the various power planes, bonding pads on the integrated-circuit die, the power P and ground G leads of the leadframe, and the metal die-attach paddle.

Figure 8:
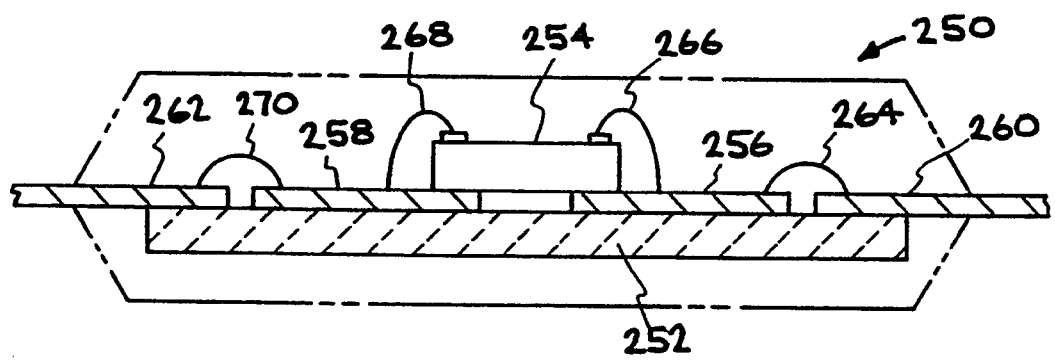
FIG. 8 is a sectional view of an integrated-circuit package which uses an electrically-insulated, heat-conducting ceramic substrate on which the integrated-circuit die is mounted and on which are formed conductive traces.

FIG. 8 is a sectional view of an integrated-circuit package configuration 250 which uses an electrically-insulated, heat-conducting ceramic substrate 252 on which an integrated-circuit die 254 is mounted and on which are formed conductive traces 256,258 to serve as power and ground planes. The Figure shows the integrated-circuit die 254 extending over the conductive traces 256, 258 formed on the substrate 252 so that a variety of integrated-circuit die sizes can be accommodated with a single configuration. The electrically-insulated, heat-conducting substrate 252 is formed of a ceramic material such as alumina nitride, beryllium oxide, or an equivalent material having good heat-conduction characteristics. The ceramic substrate 252 is bonded to the bonding-finger ends 260,262 of the leads of a leadframe. Bonding wire 264 connects the bonding finger 260 to the conductive trace 256. Bonding wire 266 connects the conductive trace 256 to a bonding pad on the integrated-circuit die 254. The ceramic substrate 252 serves as an electrically-insulated, thermally-conductive ceramic die-attach substrate for the integrated-circuit die 254. In this embodiment of an integrated-circuit package configuration, the leadframe is not conventional because it uses the ceramic substrate rather than a conventional metal die-attach pad, where the leads are formed along from a thin sheet of metal material.

Figure 9:
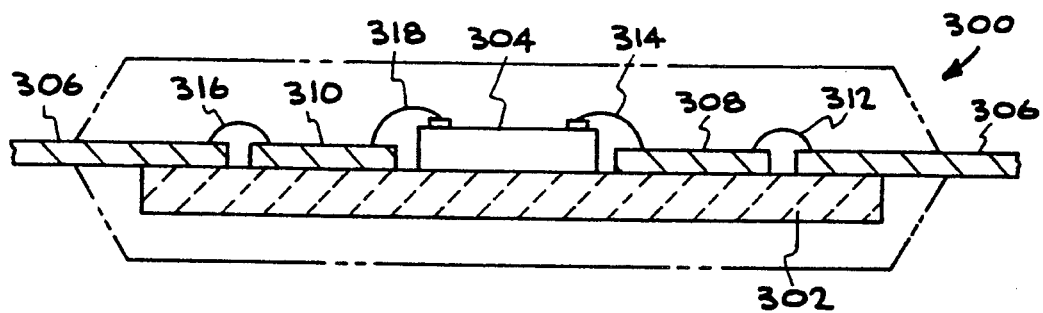
FIG. 9 is a sectional view of an electrically-insulated, heat-conducting ceramic substrate to which is attached a die, the bonding fingers of a leadframe, and conductive traces.

FIG. 9 shows an alternative packaging configuration 300, according to the invention. An electrically-insulated, heat-conducting ceramic substrate 302 has an integrated-circuit die 304 attached to its upper surface. The bonding fingers 306 of a leadframe are also attached to the upper surface of the ceramic substrate 302. Intermediate conductive traces 308,310 are deposited on the upper surface of the ceramic substrate 302 using, for example, thin-film deposition techniques or thick-film printing techniques. In this embodiment of the invention, the integrated-circuit die 304 is attached to the ceramic substrate 302 so that the die 304 does not overlie the conductive traces 308,310, as shown in the Figure.

To provide the thick film, or printed, patterns for the conductive traces, one technique is to use liquid-epoxy printing. A printing tool is provided which has a positive raised-relief of the pattern of the conductive traces formed on its surface. The printing tool is dipped in a gold-filled epoxy material and the gold-filled epoxy material is imprinted on the surface of the ceramic substrate.

Figure 10:
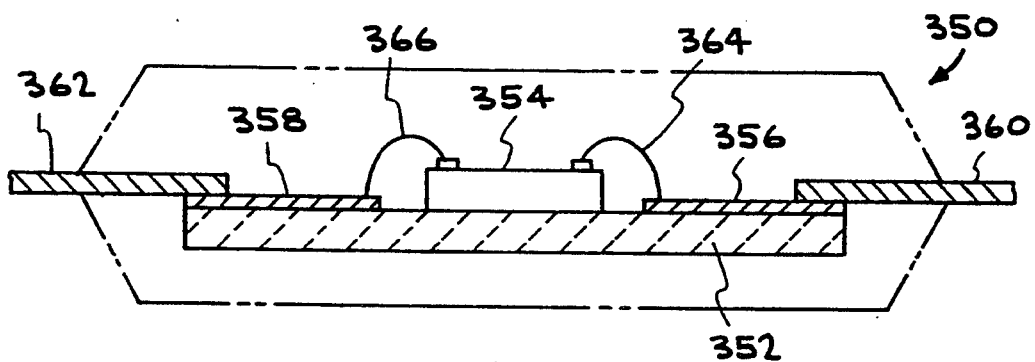
FIG. 10 is, a sectional view showing an electrically-insulated, heat-conducting ceramic substrate having conductive traces formed thereupon which are directly connected to the bonding fingers of a leadframe.

FIG. 10 shows a packaging arrangement 350 in which an electrically-insulated, heat-conducting ceramic substrate 352 has an integrated-circuit die 354 attached to its upper surface. Conductive traces 356,358 are formed on the ceramic substrate 352. Bonding fingers 360,362 of a leadframe are directly connected to the conductive traces 356,358 using the respective bonding wires 364,366. This arrangement eliminates the need for another bonding wire to connect the bonding fingers to the conductive traces 356,358.

Figure 11:
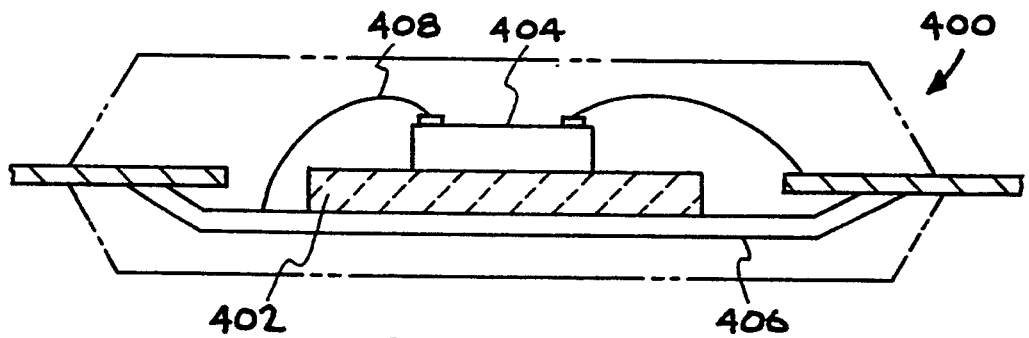
FIG. 11 is a sectional view showing an electrically-insulated, heat-conducting ceramic substrate which is mounted to a die-attach pad of a conventional leadframe.

FIG. 11 shows another embodiment of a packaging configuration 400 in which an electrically-insulated, heat-conducting ceramic substrate 402 has an integrated-circuit die 404 mounted on its upper surface. The ceramic substrate 402 is mounted to a die-attach paddle 406 of a conventional leadframe. A bonding wire 408 connects directly between the die-attach pad 406 and a bonding pad on the integrated-circuit die 404.

Figure 12:
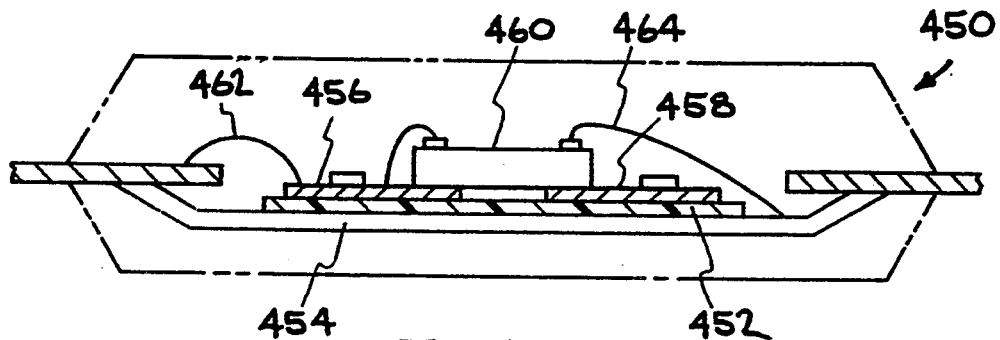
FIG. 12 is a sectional view showing an electrically-insulated, heat-conducting ceramic substrate mounted to a die-attach pad of a conventional leadframe, where the heat-conducting ceramic substrate includes conductive traces formed on its top surface and extending beneath the ceramic substrate to accommodate integrated-circuit dies of various sizes.

FIG. 12 shows another embodiment of a packaging configuration 450 in which an electrically-insulated, heat-conducting ceramic substrate 452 is mounted to a die-attach paddle 454 of a conventional leadframe. The heat-conducting ceramic substrate 452 includes conductive traces 456,458 formed on its top surface and extending beneath an integrated-circuit die 460 to accommodate integrated-circuit dies of various sizes, as shown in the conductive trace 456 is made with a bonding wire 460. Connection to the die-attach pad 454 from the die 464 is made with a bonding wire 464.

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular us contemplated. It is intended that the scope of the invention be defined by the claims appended hereto and their equivalents.

We claim:

1. An integrated-circuit package arrangement for distributing power to an integrated-circuit die, comprising:

a leadframe having a plurality of inwardly extending bonding fingers and a die-attach paddle, said inwardly extending bonding fingers disposed peripherally surrounding said die-attach paddle, a dielectric layer fixed to said die-attach paddle of said leadframe, said dielectric layer having at least one low-inductance conductive plane formed thereupon, said low-inductance conductive plane comprised of at least one electrically conductive trace, said dielectric layer comprised of a dielectric tape having upper and lower sides, said low-inductance conductive plane disposed on said upper side of said tape, and an adhesive layer disposed on said lower side of said tape, said adhesive layer attached to said die-attach paddle of said leadframe such that said adhesive layer of said dielectric tape is disposed between said die-attach paddle and said upper side of said dielectric tape, an integrated-circuit die, having a plurality of bonding pads disposed thereon, attached to said upper side of said dielectric tape, such that said dielectric tape is disposed between said integrated-circuit die and said die-attach paddle of said leadframe, and such that at least a portion of said integrated circuit die is peripherally surrounded by said said at least one electrically conductive trace, a first set of at least one bonding wire connected between respective at least one bonding pad on said integrated-circuit die and said low-inductance conductive plane, a second set of at least one bonding wire connected between respective at least one inwardly extending bonding finger of said leadframe and said low-inductance conductive plane, wherein said at least one inwardly extending bonding finger of said second set is adapted to be coupled to a voltage supply for said integrated-circuit die to thereby provide said voltage to said integrated-circuit die through said low-inductance conductive plane formed on said dielectric layer.

2. The integrated circuit package arrangement of claim 1 wherein said integrated-circuit die is attached to said upper side of said dielectric tape by a layer of nonconductive adhesive.

3. The integrated circuit package arrangement of claim 1 further including a second low-inductance conductive plane, said second plane comprised of said die attach paddle.

4. An integrated-circuit package arrangement for distributing power to an integrated-circuit die, comprising:

an electrically-insulated, heat-conducting substrate having top and bottom surface, a leadframe having a plurality of inwardly extending bonding fingers, said leadframe attached to said top surface of said electrically-insulated, heat-conducting substrate such that said inwardly extending bonding fingers are disposed peripherally surrounding a central region of said top surface of said substrate, a dielectric layer fixed to said top surface of said electrically-insulated, heat-conducting substrate, said dielectric layer having at least one low-inductance conductive plane formed thereupon, said low-inductance conductive plane comprised of at least one electrically conductive trace, said dielectric layer comprised of a dielectric tape having an upper side and a lower side, said low-inductance conductive plane disposed on said upper side of said tape, and an adhesive layer disposed on said lower side of said tape, said adhesive layer of said tape attached to said top surface of said substrate such that said adhesive layer of said dielectric tape is disposed between said top surface of said substrate and said upper side of said dielectric tape, an integrated-circuit die, having a plurality of bonding pads disposed thereon, attached to said upper side of said dielectric tape, said integrated-circuit die disposed in said central region of said top surface of said electrically-insulated, heat-conducting substrate, such that said dielectric tape is disposed between said integrated-circuit die and said top surface of said substrate, and such that said integrated-circuit die is peripherally surrounded by said inwardly extending bonding fingers of said leadframe, and such that at least a portion of said integrated circuit die is peripherally surrounded by said at least one conductive trace, a first set of at least one bonding wire connected between respective at least one bonding pad on said integrated-circuit die and said low-inductance conductive plane, a second set of at least one bonding wire connected between respective at least one inwardly extending bonding finger of said leadframe and said low-inductance conductive plane, wherein said at least one inwardly extending bonding finger of said second set is adapted to be coupled to a voltage supply for said integrated-circuit die to thereby provide said voltage to said integrated-circuit die through said low-inductance conductive plane formed on said dielectric layer.

5. The integrated circuit package arrangement of claim 4 wherein said integrated-circuit die is attached to said upper side of said dielectric tape by a layer of nonconductive adhesive.

6. An integrated-circuit package arrangement for distributing power to an integrated-circuit die, comprising:

a leadframe having a plurality of leads with bonding fingers located adjacent to a die-attach paddle;

a dielectric layer fixed to said leadframe and having at least one low-inductance conductive plane formed thereupon, said low-inductance conductive plane comprised of at least one electrically conductive trace, said integrated-circuit die being fixed to the dielectric layer such that at least a portion of said integrated-circuit die is peripherally surrounded by said at least one electrically conductive trace;

a first set of at least one bonding wire connected between respective at least one bonding pad on said integrated-circuit die and said low-inductance conductive plane, and a second set of at least one bonding wire connected between respective at least one bonding finger of said leadframe and said low-inductance conductive plane, wherein said at least one bonding finger is adapted to be coupled to a voltage supply for the integrated-circuit die to thereby provide said voltage to the integrated circuit through the low-inductance conductive plane formed on said dielectric layer.

7. An integrated-circuit package arrangement for distributing power to an integrated-circuit die, comprising:

a leadframe having a plurality of bonding fingers connected to leads of said leadframe and a centrally-located die-attach paddle, said bonding fingers located adjacent to said centrally-located die-attach paddle;

a dielectric layer fixed to said leadframe and having at least one low-inductance conductive plane formed thereupon, said low-inductance conductive plane comprised of at least one electrically conductive trace, said integrated-circuit die being fixed to the dielectric layer such that at least a portion of said integrated-circuit die is peripherally surrounded by said at least one electrically conductive trace, wherein said dielectric layer includes an electrically-insulated, heat-conducting die-attach substrate positioned in the central region of said leadframe for mounting said integrated circuit die, and wherein said substrate is fixed to said die-attach paddle of said leadframe;

a first set of at least one bonding wire connected between respective at least one bonding pad on said integrated-circuit die and said conductive plane; and a second set of at least one bonding wire connected between respective at least one bonding finger of said leadframe and said conductive plane, wherein said at least one bonding finger is adapted to be coupled to a power voltage source for the integrated-circuit die.

8. An integrated-circuit package arrangement for distributing power to an integrated-circuit die, comprising:

a leadframe having a plurality of leads with bonding fingers located adjacent to a die-attach paddle;

a dielectric layer fixed to said leadframe and having at least one low-inductance conductive plane formed thereupon, said low-inductance conductive plane comprised of at least one electrically conductive trace, said integrated-circuit die being fixed to the dielectric layer;

a first set of at least one bonding wire connected between respective at least one bonding pad on said integrated-circuit die and said low-inductance conductive plane, wherein at least one bonding finger is adapted to be coupled to a ground voltage source for said integrated-circuit die; and means for electrically connecting each of said at least one electrically conductive trace to a corresponding bonding finger of said leadframe.

9. An integrated-circuit package arrangement for distributing power to an integrated-circuit die, comprising:

a leadframe having a plurality of leads with bonding fingers located adjacent to a die-attach paddle;

a dielectric layer fixed to said leadframe and having at least one low-inductance conductive plane formed thereupon, said dielectric layer including a dielectric tape having an upper conductive layer and a lower adhesive layer for attaching said tape to a die-attach paddle of said leadframe, said low-inductance conductive plane comprised of at least one electrically conductive trace, an integrated-circuit die being fixed to the dielectric layer such that at least a portion of said integrated-circuit die is peripherally surrounded by said at least one electrically conductive trace;

a first set of at least one bonding wire connected between respective at least one bonding pad on said integrated-circuit die and said low-inductance conductive plane.

10. An integrated-circuit package arrangement for distributing power to an integrated-circuit die, comprising:

a leadframe having a plurality of leads with bonding fingers located adjacent to a die-attach paddle;

a dielectric layer fixed to said leadframe, said dielectric layer comprised of an electrically-insulated, heat-conductive substrate mounted in the central region of said leadframe for mounting an integrated-circuit die thereon, said substrate having a first surface to which the ends of said bonding fingers are fixed near the periphery of said substrate; and having at least one low-inductance conductive plane formed thereupon, said low-inductance conductive plane comprised of at least one electrically conductive trace, said at least one low-inductance electrically conductive plane disposed on said first surface of said electrically-insulated, heat-conductive die-attach substrate, said integrated-circuit die being fixed to the dielectric layer such that at least a portion of said integrated-circuit die is peripherally surrounded by said at least one electrically conductive trace;

a first set of at least one bonding wire connected between respective at least one bonding pad on said integrated-circuit die and said low-inductance conductive plane.

11. An integrated-circuit package arrangement for distributing power to an integrated-circuit die, comprising:

a leadframe having a plurality of leads with bonding fingers located adjacent to a die-attach paddle;

a dielectric layer fixed to said leadframe, said dielectric layer comprised of an electrically-insulated, heat-conductive substrate mounted in the central region of said leadframe for mounting an integrated-circuit die thereon, said substrate having a first surface to which the ends of said bonding fingers are fixed near the periphery of said substrate; and having at least one low-inductance conductive plane formed thereupon, said low-inductance conductive plane comprised of at least one electrically conductive trace, said at least one low-inductance electrically conductive plane disposed on said first surface of said electrically-insulated, heat-conductive die-attach substrate, said integrated-circuit die being fixed to the dielectric layer such that at least a portion of said integrated-circuit die is peripherally surrounded by said at least one electrically conductive trace and such that said at least one low-inductance conductive plane extends from the central area of said substrate such that said integrated-circuit die overlies portions of said at least one low-inductance conductive plane; and a first set of at least one bonding wire connected between respective at least one bonding pad on said integrated-circuit die and said low-inductance conductive plane.

12. An integrated-circuit package arrangement for distributing power to an integrated-circuit die, comprising:

a leadframe having a plurality of leads with bonding fingers located adjacent to a die-attach paddle;

a dielectric layer fixed to said leadframe, said dielectric layer comprised of a ceramic electrically-insulated, heat-conductive substrate mounted in the central region of said leadframe for mounting an integrated-circuit die thereon, said substrate having a first surface to which the ends of said bonding fingers are fixed near the periphery of said substrate; and having at least one low-inductance conductive plane formed thereupon, said low-inductance conductive plane comprised of at least one electrically conductive trace, said at least one low-inductance electrically conductive plane disposed on said first surface of said electrically-insulated, heat-conductive die-attach substrate, said integrated-circuit die being fixed to the dielectric layer such that at least a portion of said integrated-circuit die is peripherally surrounded by said at least one electrically conductive trace;

a first set of at least one bonding wire connected between respective at least one bonding pad on said integrated-circuit die and said low-inductance conductive plane.

13. An integrated-circuit package arrangement for distributing power to an integrated-circuit die, comprising:
- a leadframe having a plurality of leads with bonding fingers located adjacent to the die-attach paddle;
- a dielectric layer fixed to said leadframe, said dielectric layer comprised of a ceramic electrically-insulated, heat-conductive substrate mounted in the central region of said leadframe for mounting an integrated-circuit die thereon, and having at least one low-inductance conductive trace formed thereupon, said conductive traces are formed of a printed thick-film material, said integrated-circuit die being fixed to said dielectric layer;
- a first set of one or more bonding wires connected between respective one or more bonding pads on said integrated-circuit die and said conductive plane; and
- means for electrically connecting each of said conductive traces to a corresponding bonding finger of said leadframe.

14. An integrated-circuit package arrangement for distributing power to an integrated-circuit die, comprising:
- a leadframe having a plurality of leads with bonding fingers located adjacent to the die-attach paddle;
- a dielectric layer fixed to said leadframe, said dielectric layer comprised of a ceramic electrically-insulated, heat-conductive substrate mounted in the central region of said leadframe for mounting an integrated-circuit die thereon, and having at least one low-inductance conductive trace formed thereupon, said conductive traces are formed of a deposited thin-film material, said integrated-circuit die being fixed to said dielectric layer;
- a first set of one or more bonding wires connected between respective one or more bonding pads on said integrated-circuit die and said conductive plane; and
- means for electrically connecting each of said conductive traces to a corresponding bonding finger of said leadframe.

15. An integrated-circuit package arrangement for distributing power to an integrated-circuit die, comprising:
- a leadframe having a plurality of leads with bonding fingers located adjacent to a die-attach substrate;
- a dielectric layer fixed to said leadframe and having at least one low-inductance conductive plane formed thereupon, said low-inductance conductive plane comprised of at least one electrically conductive trace, said integrated-circuit die being fixed to the dielectric layer; wherein said at least one low-inductance conductive plane extends from the central area of the die-attach substrate such that the integrated-circuit die is fixed to the die-attach substrate without overlying said at least one low-inductance conductive plane on said die-attach substrate,
- a first set of at least one bonding wire connected between respective at least one bonding pad on said integrated-circuit die and said low-inductance conductive plane; and
- means for electrically connecting each of said at least one electrically conductive trace to a corresponding bonding finger of said leadframe.

16. An integrated-circuit package arrangement for distributing power to an integrated-circuit die, comprising:
- a leadframe having a plurality of leads with bonding fingers located adjacent to an electrically-insulated, heat-conductive die-attach substrate; wherein said electrically-insulated, heat-conductive die-attach substrate is formed of a ceramic material,
- a dielectric layer fixed to said leadframe and having at least one low-inductance conductive plane formed thereupon, said low-inductance conductive plane comprised of at least one electrically conductive trace, said integrated-circuit die being fixed to the dielectric layer;
- a first set of at least one bonding wire connected between respective at least one bonding pad on said integrated-circuit die and said low-inductance conductive plane; and
- means for electrically connecting each of said at least one electrically conductive trace to a corresponding bonding finger of said leadframe.

17. An integrated-circuit package arrangement for distributing power to an integrated-circuit die, comprising:
- a leadframe having a plurality of leads with bonding fingers located adjacent to an electrically-insulated, heat-conductive die-attach substrate; wherein said electrically-insulated, heat-conductive die-attach substrate is formed of a ceramic material selected from the group comprising alumina nitride and beryllium oxide,
- a dielectric layer fixed to said leadframe and having at least one low-inductance conductive plane formed thereupon, said low-inductance conductive plane comprised of at least one electrically conductive trace, said integrated-circuit die being fixed to the dielectric layer;
- a first set of at least one bonding wire connected between respective at least one bonding pad on said integrated-circuit die and said low-inductance conductive plane; and
- means for electrically connecting each of said at least one electrically conductive trace to a corresponding bonding finger of said leadframe.

18. An integrated-circuit package arrangement for distributing power to an integrated-circuit die, comprising:
- a leadframe having a centrally-located die-attach paddle and a plurality of bonding fingers connected to leads of the leadframe, said bonding fingers being located adjacent to the die-attach paddle;
- a dielectric tape having an upper conductive layer and a lower adhesive layer for attaching said tape to the die-attach paddle of the leadframe;
- wherein said integrated-circuit die is fixed to the upper conductive layer of said tape.

* * * * *